United States Patent
Shin et al.

(10) Patent No.: US 12,235,286 B2
(45) Date of Patent: Feb. 25, 2025

(54) SHIELD BOX FOR TESTING MOBILE TELECOMMUNICATION TERMINAL

(71) Applicant: INNOWIRELESS CO., LTD., Seongnam-si (KR)

(72) Inventors: Kuei Nam Shin, Seongnam-si (KR); Ho Jin Kim, Suwon-si (KR); Young Su Kwak, Suwon-si (KR)

(73) Assignee: INNOWIRELESS CO., LTD., Seongnam-si (KR)

( * ) Notice: Subject to any disclaimer, the term of this patent is extended or adjusted under 35 U.S.C. 154(b) by 175 days.

(21) Appl. No.: 18/091,665

(22) Filed: Dec. 30, 2022

(65) Prior Publication Data
US 2023/0243868 A1    Aug. 3, 2023

(30) Foreign Application Priority Data
Jan. 28, 2022  (KR) .................. 10-2022-0013670

(51) Int. Cl.
*G01R 31/00* (2006.01)
*G01R 1/04* (2006.01)
*H04M 1/24* (2006.01)

(52) U.S. Cl.
CPC .............. *G01R 1/04* (2013.01); *H04M 1/24* (2013.01)

(58) Field of Classification Search
CPC .. G01R 29/10; G01R 29/105; G01R 29/0814; G01R 29/0821; G01R 29/0878; G01R 29/0892; G01R 29/0871; G01R 31/001; G01R 1/04; G01R 1/18; G01R 1/0018
See application file for complete search history.

(56) References Cited

U.S. PATENT DOCUMENTS

| | | | |
|---|---|---|---|
| 11,399,450 B2* | 7/2022 | Embleton | H05K 9/0041 |
| 11,609,254 B2* | 3/2023 | Shen | G01R 31/2862 |
| 2013/0194772 A1* | 8/2013 | Rojo | H05K 13/00 |
| | | | 29/407.01 |

(Continued)

FOREIGN PATENT DOCUMENTS

| | | | |
|---|---|---|---|
| JP | 2004072190 | * | 3/2004 |
| JP | 2007101445 | * | 4/2007 |

(Continued)

*Primary Examiner* — Thang X Le
(74) *Attorney, Agent, or Firm* — Kaplan Breyer Schwarz, LLP

(57) ABSTRACT

The present disclosure relates to a shield box for testing a mobile telecommunication terminal in which an increase in temperature in a shield box is prevented in performing various tests on a mobile telecommunication terminal having multiple antennas in an Over The Air (OTA) method to perform a stable test.

The shield box for testing a communication terminal of the present disclosure includes a shield box main body made of metal, having a jig entrance formed on the front side, and equipped with a vent which a plurality of vent holes of 1 to 10 mm in size are formed on the upper and rear sides, respectively; a test jig assembly installed to be able to enter and exit through the jig entrance while mounting a PCB for non-contact wireless connection in which a plurality of non-contact wireless connection parts that are wirelessly connected to a mobile telecommunication terminal and transmit and receive signals are arranged; and a ventilation fan mounted on the upper vent or the rear vent.

16 Claims, 15 Drawing Sheets

(56) References Cited

U.S. PATENT DOCUMENTS

2022/0128623 A1* 4/2022 Chang .................. G01R 31/311
2023/0333132 A1* 10/2023 Zhang ................. G01M 99/008

FOREIGN PATENT DOCUMENTS

| JP | 2008235730 | * | 10/2008 |
| KR | 10-1689530 B1 | | 12/2016 |
| KR | 10-2129268 A | | 3/2020 |
| KR | 10-2020-0144010 A | | 12/2020 |

* cited by examiner

SHIELD BOX FOR TESTING MOBILE TELECOMMUNICATION TERMINAL

CROSS-REFERENCE TO RELATED APPLICATION

This application claims priority to and the benefit of Korean Patent Application No. 2022-0013670, filed on Jan. 28, 2022, the disclosure of which is incorporated herein by reference in its entirety.

TECHNICAL FIELD

The present disclosure relates to a shield box for testing a mobile telecommunication terminal, and particularly a shield box for testing a mobile telecommunication terminal in which an increase in temperature in a shield box is prevented in performing various tests on a mobile telecommunication terminal having multiple antennas in an Over The Air (OTA) method to perform a stable test.

DESCRIPTION OF THE RELATED ART

Recently, as the mobile telecommunication terminal uses multiple antennas (hereinafter referred to as 'multiple antennas') to increase channel capacity as well as antennas supporting multiple bands in line with various communication environments, OTA (Over The Air) test is the preferred trend.

When a mobile telecommunication terminal uses an OTA channel for protocol and various function tests, two methods are used: a method of transmitting and receiving signals using an antenna and a method of transmitting and receiving signals using a near-field coupler. Both of these methods use a shield room or a shield box to block external interference to the mobile telecommunication terminal, in the case of a relatively large sealed room, the space cost is high, so a shield box is generally used.

Meanwhile, when an antenna, for example, a patch antenna is installed and used inside the shield box, a large deviation occurs in the level of signals transmitted and received by the mobile telecommunication terminal depending on the location of the antenna and the location of the mobile telecommunication terminal, which greatly affects the data transmission speed.

The following related art 1 is a prior patent disclosure of the present applicant, and discloses a shield box for testing a wireless terminal including: largely, a metal box; a probe antenna embedded in a metal box, located directly above or directly below the antenna part of a mobile telecommunication terminal housed in the metal box, to receive signals from a mobile telecommunication terminal antenna in a non-contact manner; a first radio wave absorber that is attached to the entire inner surface of a metal box except for the terminal storage space of the same size as the mobile telecommunication terminal and prevents radio waves emitted from the mobile telecommunication terminal antenna from being reflected inside the metal box; and a second radio wave absorber attached to the probe antenna to be interposed between the probe antenna and the mobile telecommunication terminal antenna.

The following related art 2 is also a related art patent disclosure of the present applicant, and is proposed to solve the matter of the related art 1, that is, the matter that it may not be universally used in various mobile telecommunication terminals because the position of the probe antenna and the position and size of the radio wave absorber must be changed for each type of mobile telecommunication terminal.

This related art 2 discloses an interference component canceling apparatus and method for testing a multi-antenna wireless device, which cancels the interference component generated in the process of testing by connecting the mobile telecommunication terminal with multiple antennas to the shield box wirelessly (non-contact) using signal processing technology, thereby supporting various tests for mobile telecommunication terminals with multiple antennas to be performed simply and with high reliability.

The following related art 3 is also a prior patent application disclosure of the present applicant, and discloses a wireless connection apparatus for a terminal having multiple antennas that performs wireless communication with terminal antennas using probe antennas equal to or greater than the number of terminal antennas of a mobile telecommunication terminal, which includes; a shield box accommodating a mobile telecommunication terminal, a plurality of probe antennas disposed inside the shield box, and an RF connector disposed in an appropriate position of the shield box and provided to correspond one-to-one or many-to-one with the probe antennas.

However, the above-mentioned related arts 1 to 3 are conceptual disclosures for a shield box that is connected to a mobile telecommunication terminal in a non-contact (wireless) manner and performs various tests on the mobile telecommunication terminal, in which the versatility of testing a variety of mobile telecommunication terminals is poor, and the temperature of the mobile telecommunication terminal continuously rises as the test progresses because it has a closed structure to block radio interference outside the shield box.

RELATED ART LITERATURE

Related art 1: Registered Patent Publication No. 10-1689530 (Title of Invention: Shield box for wireless terminal test)

Related art 2: Registered Patent Publication No. 10-2129268 (Title of Invention: Apparatus and method for canceling interference components for testing multi-antenna wireless device)

Related art 3: Patent application publication No. 10-2020-0144010 (Title of invention: Wireless connection apparatus for a terminal having multiple antennas)

DISCLOSURE OF THE INVENTION

Technical Goals

The present disclosure was made to solve the above matters, and, in performing various tests on a mobile telecommunication terminal having multiple antennas in an Over The Air (OTA) method, the present disclosure is for the purpose of providing a shield box for testing mobile telecommunication terminals to prevent a temperature rise inside the shield box so that a stable test may be performed.

Technical Solutions

According to an aspect, there is provided a shield box for testing mobile telecommunication terminals is made of metal, has a jig entrance formed on the front side, and it is made including: a shield box main body equipped with a vent in which a plurality of vent holes of 1 to 10 millimeter (mm) in size are formed on the upper and rear sides, respectively; a test jig assembly installed to be able to enter and exit through the jig entrance while mounting a printed circuit board (PCB) for non-contact wireless connection in which a plurality of non-contact wireless connection parts that are wirelessly connected to a mobile telecommunication terminal and transmit/receive signals are arranged; and a ventilation fan mounted on the upper vent or the rear vent.

In the above configuration, the upper vent is an intake vent, the rear vent is an exhaust vent, an intake fan is mounted on the intake vent, and an exhaust fan is mounted on the exhaust vent.

An intake fan bracket in which the intake hole is formed and the intake fan is fixed is mounted in the intake vent, and an exhaust fan bracket in which the exhaust hole is formed and the exhaust fan is fixed is mounted in the exhaust vent.

The upper half of the shield box main body is made of metal and is covered with an upper cover in which a plurality of heat dissipation holes is formed on at least one side of both side surfaces, and the lower half of the shield box main body is made of metal and is covered with a lower cover having a plurality of heat dissipation holes formed on at least one side of both sides or the lower surface, and a pedestal for separating the shield box from the bottom surface is installed at each corner of the lower surface of the lower cover.

The test jig assembly includes a jig frame on which the PCB for the non-contact wireless connection is mounted; a front panel mounted on the front of the jig frame and having a radio frequency (RF) cable connector installed thereon; a PCB sheet installed on the jig frame and on which the PCB for the non-contact wireless connection is placed; a terminal interface box equipped with various interfaces with mobile telecommunication terminals and a clamping part installed at the rear of the jig frame and firmly fixing mobile telecommunication terminals of various sizes to the predetermined position of the jig frame by the elastic force of the compression spring.

A heat sink for dissipating heat from the PCB sheet is installed in the shield box main body below the PCB sheet.

A magnet is mounted on the heat sink without forming a step with the upper surface, and a magnetic material fixing groove into which a magnetic piece of iron having magnetism is inserted without a step with the lower surface is formed on the lower surface of the PCB sheet.

The non-contact wireless connection part is a patch antenna.

The non-contact wireless connection part is an RF coupler.

The PCB for non-contact wireless connection is made of a PCB having a Coplanar Waveguide with Ground (CPWG) structure in which a ground is disposed on top and bottom of a dielectric.

On the upper surface of the PCB for non-contact wireless connection, an RF coupler is arranged in a matrix form of two or more rows horizontally and two or more columns vertically and designed to maximize the distance between transmission lines to minimize inductive components between transmission lines, a feeding part for supplying power to the RF coupler is disposed on the lower surface of the PCB for non-contact wireless connection, and each of the RF couplers and each of the feeding part are electrically connected through a via hole connection part having a surface thereof made of a conductor.

The upper surface ground and the lower surface ground of the PCB for non-contact wireless connection are connected to each other through a via hole whose surface is made of a conductor.

The jig frame is formed of a non-metallic material having an opening through which the RF coupler is exposed and a terminal accommodating port in which a mobile telecommunication terminal is accommodated.

A universal serial bus (USB) cable fixing groove in which a USB cable connected to a USB connection jack of a mobile telecommunication terminal is fixed is formed in the jig frame at the center of the front surface of the terminal accommodating port.

The PCB sheet is made of metal, and a cable passage groove through which an internal RF cable connecting the feeding part and the RF cable connector passes is formed at a central portion.

The front panel has a handle for opening and closing for holding the test jig assembly by hand and moving it in and out of the shield box main body, and a locking lever equipped with a clamping function for firmly fixing the test jig assembly housed in the shield box main body to the shield box main body with a spring provided therein.

An RF coupler arrangement table indicating an arrangement position of each of the RF couplers is attached to the front panel.

Jig entry and exit guide members installed on both sides of the shield box main body to guide entry and exit of the test jig assembly, and a spring plunger for holding the test jig assembly in right position by applying pressure to the jig entry and exit guide members in a state where the test jig assembly is accommodated inside the shield box main body are further provided.

The terminal interface box is electrically connected to an audio jack and a USB jack of the mobile telecommunication terminal, and includes an audio codec and a Bluetooth communication module for Bluetooth communication with the mobile telecommunication terminal.

Effects

According to the shield box for testing a mobile telecommunication terminal of the present disclosure, in testing a mobile telecommunication terminal having multiple antennas, it may be applied to a Multi-Input Multi-Output (MIMO) channel while having high coupling performance, and by providing an Over The Air (OTA) channel environment with minimal variability and maintaining a constant temperature regardless of the external temperature environment, 5 generation (5G) interworking test may be conducted without network switching for a long time.

BRIEF DESCRIPTION OF THE DRAWINGS

FIG. 8 is an enlarged view of the top surface structure of one RF coupler in FIG. 7a.

DETAILED DESCRIPTION FOR CARRYING OUT THE INVENTION

Hereinafter, a preferred example embodiment of the shield box for testing a mobile telecommunication terminal according to the present disclosure will be described in detail with reference to the accompanying drawings.

An important factor in the protocol and function test of a mobile telecommunication terminal using an OTA channel is to maintain consistency so that the performance of a mobile telecommunication terminal does not change due to external environments, and the range of consistent performance is as follows.

1. Maintaining the signal level transmitted and received by a mobile telecommunication terminal to be constant by maintaining a constant path loss due to a wireless channel: Since the size of the signal transmitted and received by the mobile telecommunication terminal is greatly influenced by the external test environment, that is, the size of the signal is sensitively changed by the angle and direction of the external transmission and reception antenna, the angle and direction of the terminal antenna and the reflected wave, and so on, fluctuates sensitively and has a great influence on the test result, it is important to have an environment where consistent signals may be transmitted and received.

2. Preventing temperature rise of mobile telecommunication terminals to prevent network switching or performance change due to temperature rise: Recently, mobile telecommunication terminals supporting 5 Generation (5G) communication have relatively increased heat compared to 4G communication due to data throughput and high output, and are designed to automatically switch from the 5G network to the 4G network when the heat is severe. Accordingly, when the terminal is placed in a sealed shield box and the heat is severe during the 5G network interworking test, it is difficult to conduct the 5G network interworking test for a long time because the network is automatically switched to the 4G network. In addition, the temperature rise of the mobile telecommunication terminal leads to deterioration of the RF signal, which has a great influence on obtaining consistent test results.

3. Maintaining low crosstalk performance while selectively transmitting and receiving signals on multiple-input and multiple-output (MIMO) channels: In general, when using the capacitive coupling method, a single-input and single-output (SISO) type coupler is used, and in this case, there is no method for distinguishing MIMO signals for each channel of a mobile telecommunication terminal adopting a MIMO antenna. Accordingly, when a plurality of antennas is installed around a mobile telecommunication terminal, it is difficult to analyze a channel environment due to high crosstalk between antennas.

Figure 1:
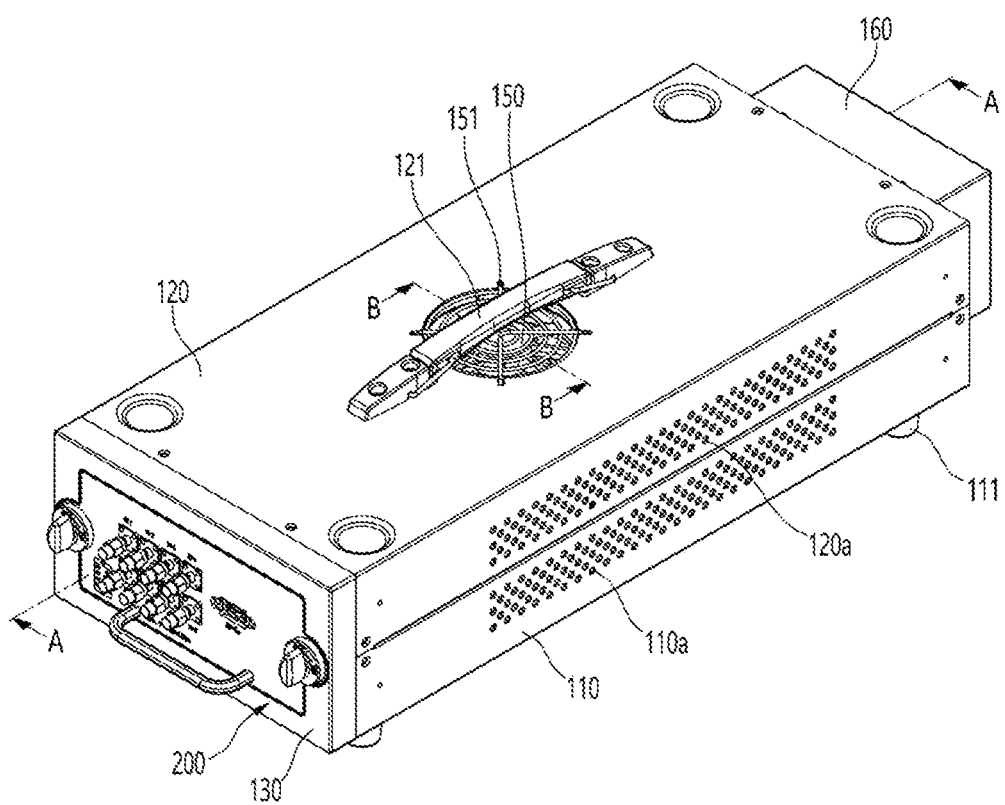
FIG. 1 is a perspective view of a shield box for testing a mobile telecommunication terminal according to an example embodiment of the present disclosure.
Figure 2A:
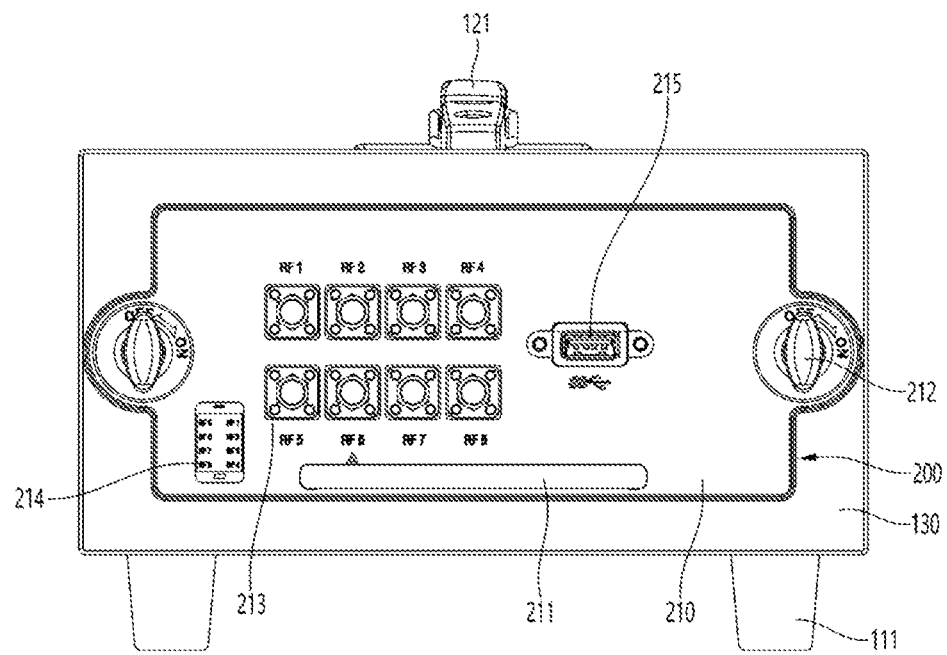
FIG. 2a and FIG. 2b are front and rear views of the shield box for testing a mobile telecommunication terminal shown in FIG. 1, respectively.
Figure 2B:
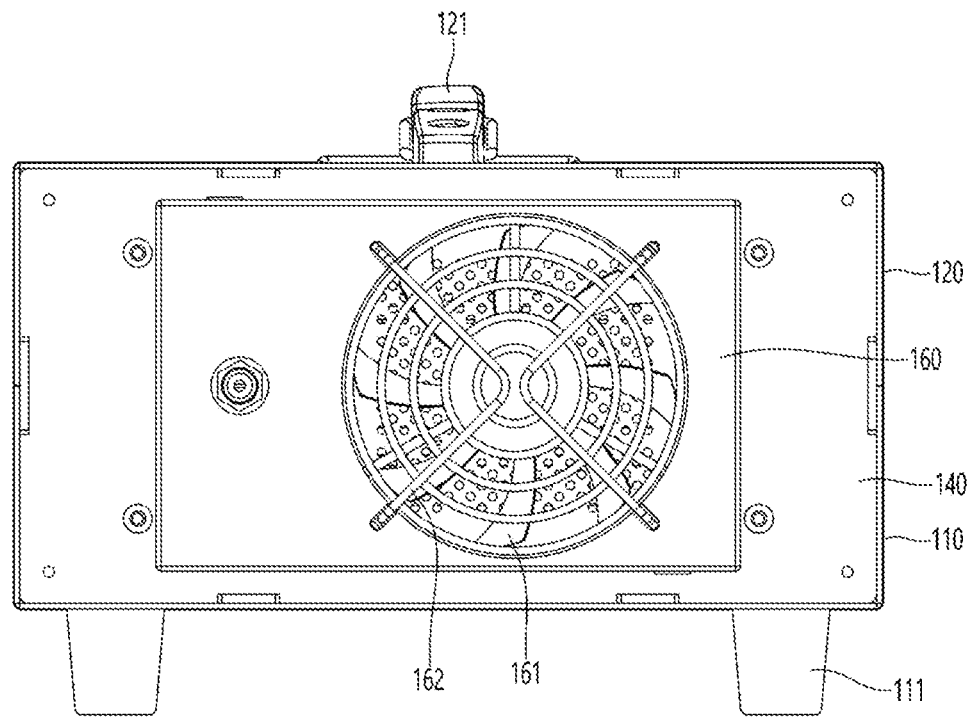

FIG. 1 is a perspective view of a shield box for testing a mobile telecommunication terminal according to an example embodiment of the present disclosure, and FIG. 2a and FIG. 2b are front and rear views of the shield box for testing a mobile telecommunication terminal shown in FIG. 1, respectively.

Figure 3:
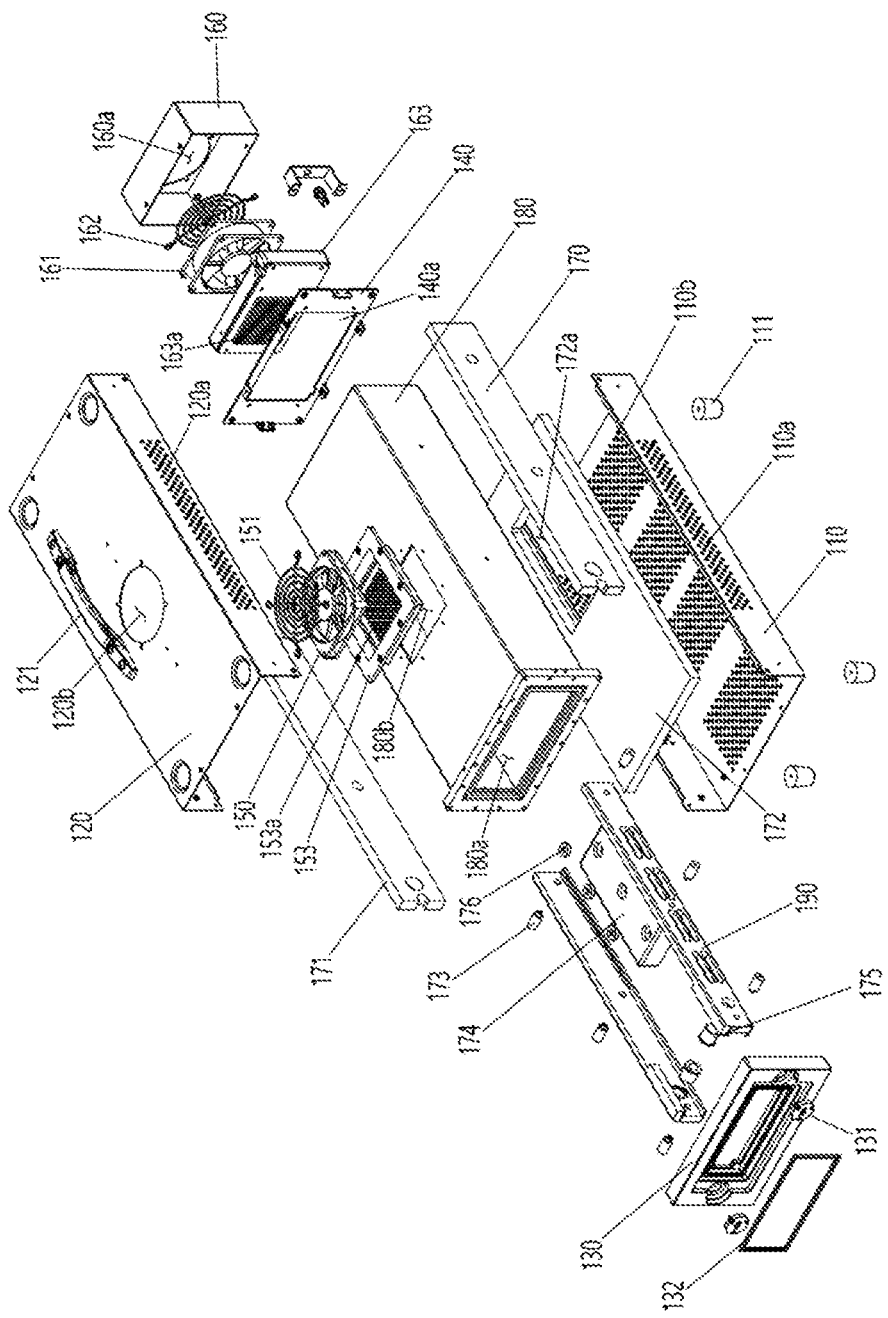
FIG. 3 is an exploded perspective view of a shield box for testing a mobile telecommunication terminal shown in FIG. 1.
Figure 4:
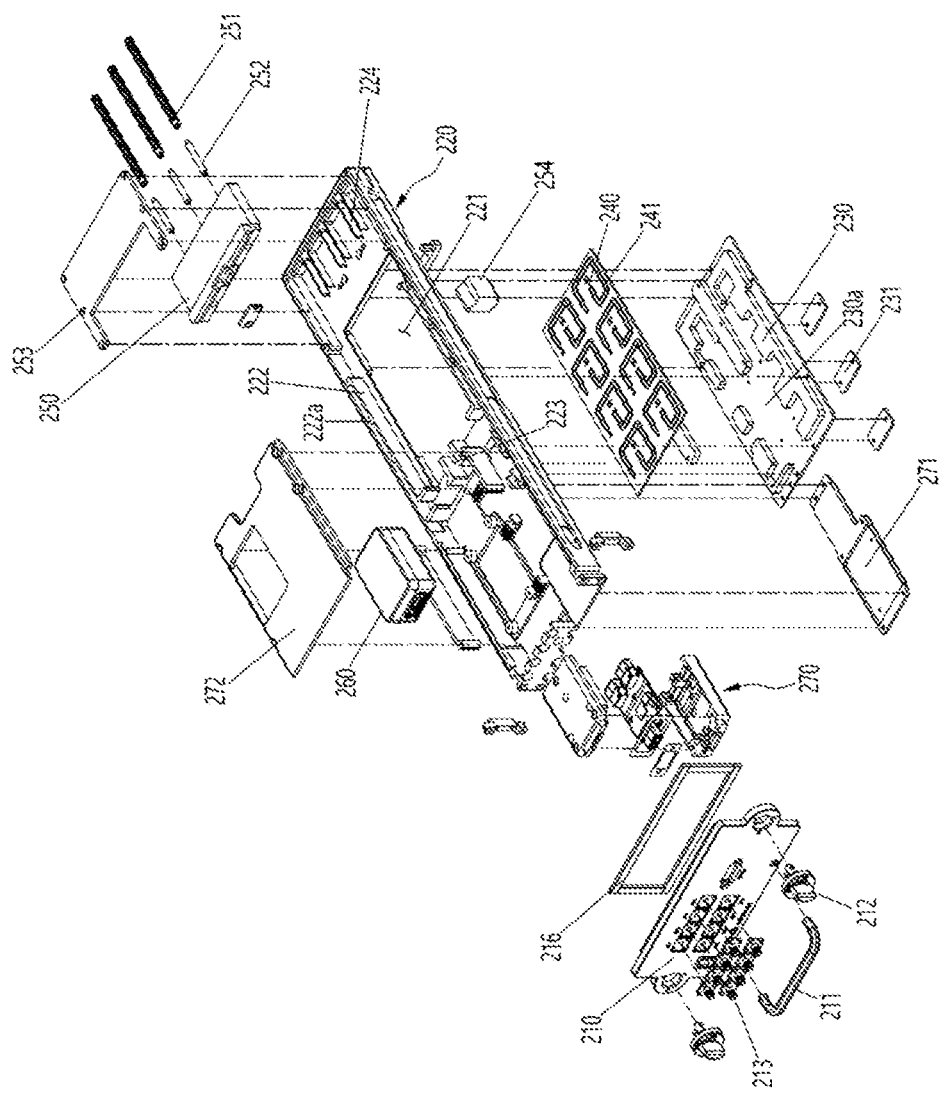
FIG. 4 is an exploded perspective view of a test jig assembly in a shield box for testing a mobile telecommunication terminal shown in FIG. 1.
Figure 5:
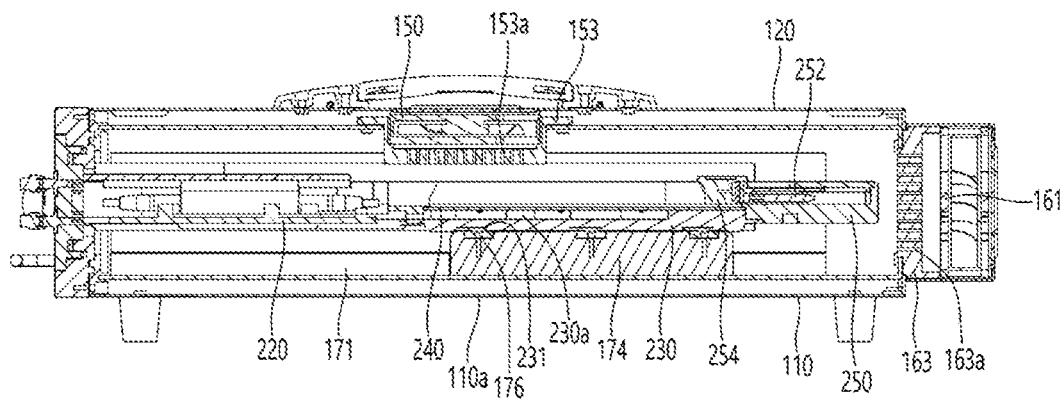
FIG. 5 is a longitudinal cross-sectional view taken along line A-A in FIG. 1.
Figure 6:
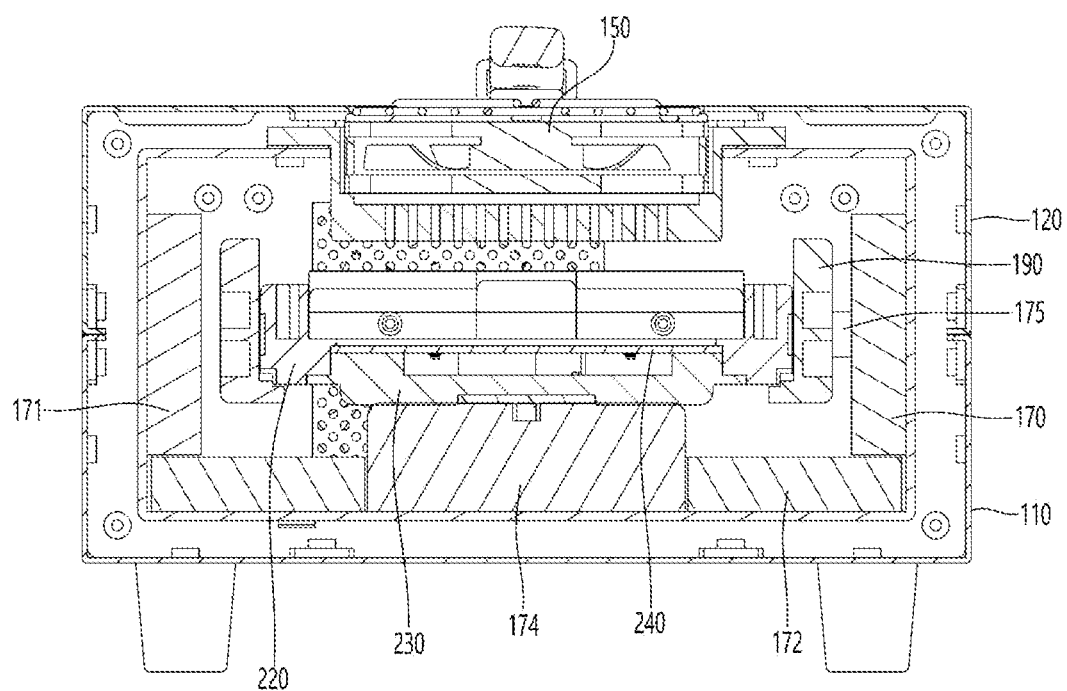
FIG. 6 is a longitudinal cross-sectional view taken along line B-B in FIG. 1.

FIG. 3 is an exploded perspective view of a shield box for testing a mobile telecommunication terminal shown in FIG. 1 and FIG. 4 is an exploded perspective view of a test jig assembly in a shield box for testing a mobile telecommunication terminal shown in FIG. 1. FIG. 5 is a longitudinal cross-sectional view taken along line A-A in FIG. 1 and FIG. 6 is a longitudinal cross-sectional view taken along line B-B in FIG. 1.

As shown in FIG. 1 to FIG. 6, the shield box for testing a mobile telecommunication terminal of the present disclosure includes a shield box main body 180 largely made of metal and having a rectangular parallelepiped shape having a jig entrance 180a formed on the front side, and test jig assembly 200 installed to be accessible through the jig entrance 180a of the shield box main body 180 while mounting the RF coupling PCB 240 in which a plurality of RF couplers 241 for wireless (OTA) testing are arranged.

In the configuration described above, the upper half of the shield box main body 180 is covered with the upper cover 120 made of metal and having a plurality of heat dissipation holes 120a formed thereon on an appropriate place, for example, on both sides. The lower half of the shield box main body 180 is also made of metal and is covered with a lower cover 110 having a plurality of heat dissipation holes 110a formed therein on an appropriate place, for example, on both sides and the lower surface.

An intake vent 120b is formed at an appropriate place, for example, on the upper surface of the upper cover 120, to which an intake fan 150 for sucking in external air is installed to dissipate heat inside the shield box main body 180. Reference numeral 121 denotes a carrying handle installed on the upper surface of the upper cover 120 to lift and move the shield box.

A pedestal, preferably a rubber pedestal 111, is installed at each corner of the lower surface of the lower cover 110 to separate the shield box from the bottom surface.

A front frame 130 physically contacting the test jig assembly is installed at the entrance of the jig of the shield box main body, and clamping plates 131 are provided on both sides of the front frame 130 to clamp a locking lever 212 described later. Reference numeral 132 denotes an Electro Magnetic Interference (EMI) gasket interposed between the jig entrance 180a of the shield box main body 180 and the front frame 130 to meet the EMI standard.

Next, the test jig assembly 200 may include a jig frame 220 on which the aforementioned RF coupling PCB 240 is mounted, a front panel 210 mounted on the front of the jig frame 220 and having an RF cable connector 213 and a USB cable connector 215 installed thereon, a PCB sheet 230 installed on the jig frame 220 and on which the RF coupling PCB 240 is placed, a terminal interface box 260 equipped with various interfaces with the terminal, a USB hub assembly 270 having a plurality of USB connectors connected to an external device, for example, a test PC (not shown) in which a terminal test program is installed and a terminal through a USB interface, and a clamping slide 250 that firmly fixes terminals of various sizes to a predetermined position of the jig frame 220.

The front panel 210 includes a handle 211 for opening and closing for holding the test jig assembly 200 by hand and moving it in and out of the shield box main body 180, the plurality of RF cable connectors 213 and the USB cable connector 215 described above, and a locking lever 212 having a clamping function for firmly fixing the test jig assembly 200 housed in the shield box main body 180 with a spring (not shown) therein to the shield box main body 180.

Reference numeral 214 denotes an RF coupler arrangement table attached to the front panel 210 and indicating an arrangement position of each RF coupler 241. Reference numeral 216 denotes an EMI gasket interposed between the front panel 210 and the front frame 130 to meet EMI standards.

The jig frame 220 may be formed of a non-metallic material, for example, a plastic injection molding material, and the jig frame 220 has an opening through which the RF coupler 241 is exposed to form a terminal accommodating port 221 in which a terminal is accommodated.

Meanwhile, mobile telecommunication terminals have different sizes, particularly vertical lengths, and, in order to firmly fix such various types of terminals inside the jig frame 220, a spring pocket 224 in which a compression spring 251, preferably a coil spring, is accommodated which maintains the clamping slide 250 in a forward state at all times, is formed on the rear side of the jig frame 220.

Reference numeral 252 denotes a spring pin inserted into the compression spring 251, 253 denotes a slide cover covering the clamping slide 250, and 254 denotes a terminal clamper that presses the terminal in direct contact with the terminal.

Meanwhile, a USB cable fixing groove 223 is formed in the center of the front surface of the terminal accommodating port 221 of the jig frame 220 to fix a USB cable connected to a USB connection jack formed in the center of the horizontal part of the terminal. In this way, the shield box of the present disclosure may perform test while firmly fixing mobile telecommunication terminals of various sizes to a predetermined position inside the jig frame 220.

On both sides of the jig frame 220, an audio cable fixing wall 222 is formed in which an audio cable connected to the audio connection jack of the terminal is accommodated and fixed, and an inner side of the audio cable fixing wall 222 is formed with a pressing protrusion 222a for pressing the audio cable stored therein so as not to be separated.

The RF coupling PCB 240 has a plurality of RF couplers 241, for example, arranged in a 2*4 matrix on the upper surface, and it adopts Coplanar Waveguide with Ground (CPWG) structured PCB in which ground is provided on the top and bottom of the dielectric to increase heat conduction efficiency through a wide ground.

Figure 7A:
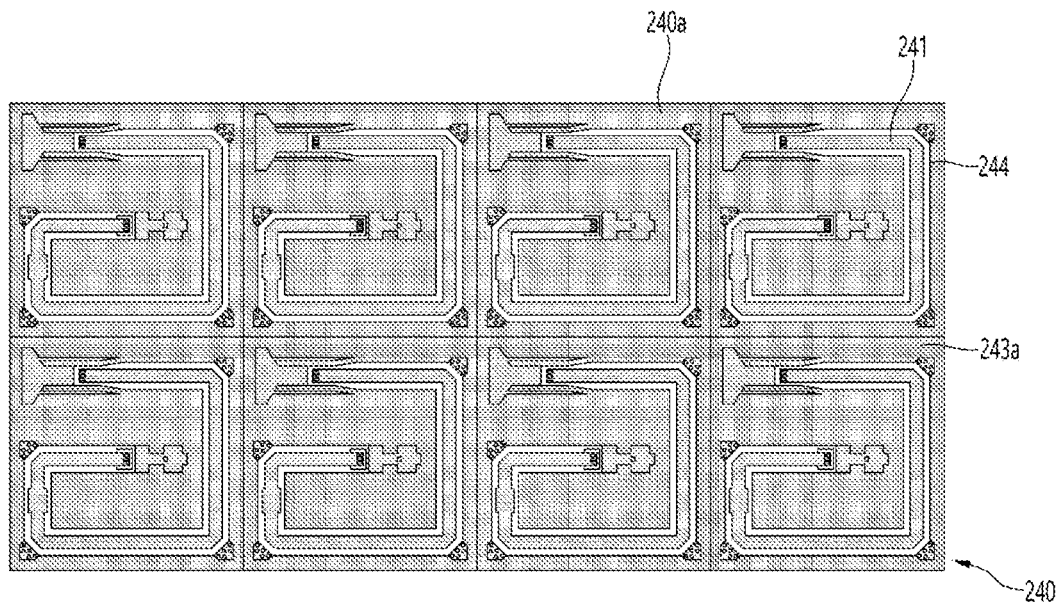
FIG. 7a and FIG. 7b are top and bottom views of an RF coupling PCB in a shield box for testing a mobile telecommunication terminal according to an example embodiment of the present disclosure, respectively.
Figure 7B:
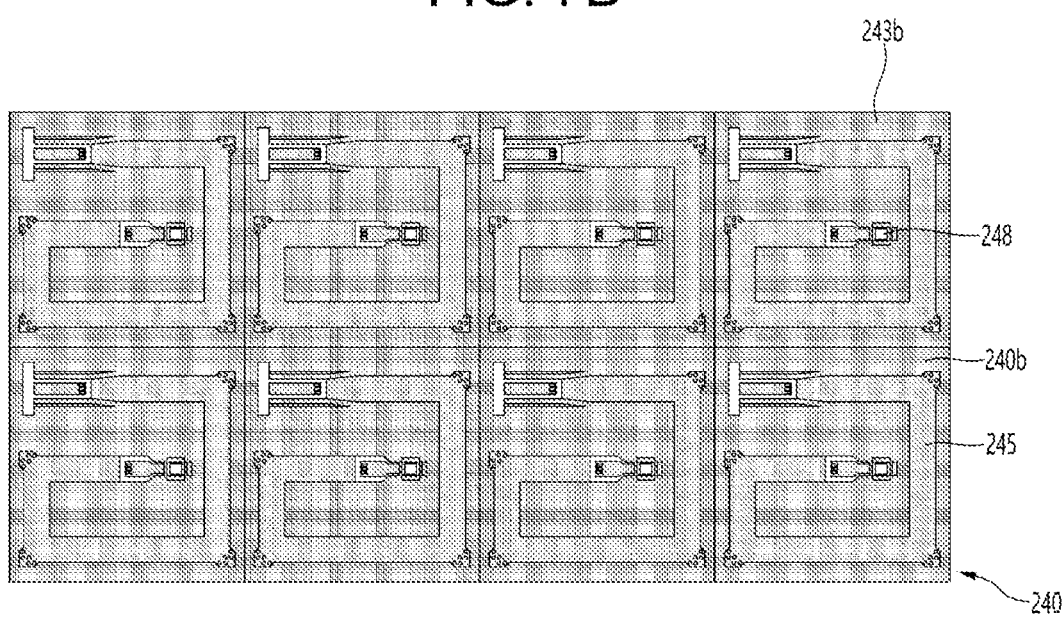
Figure 8:
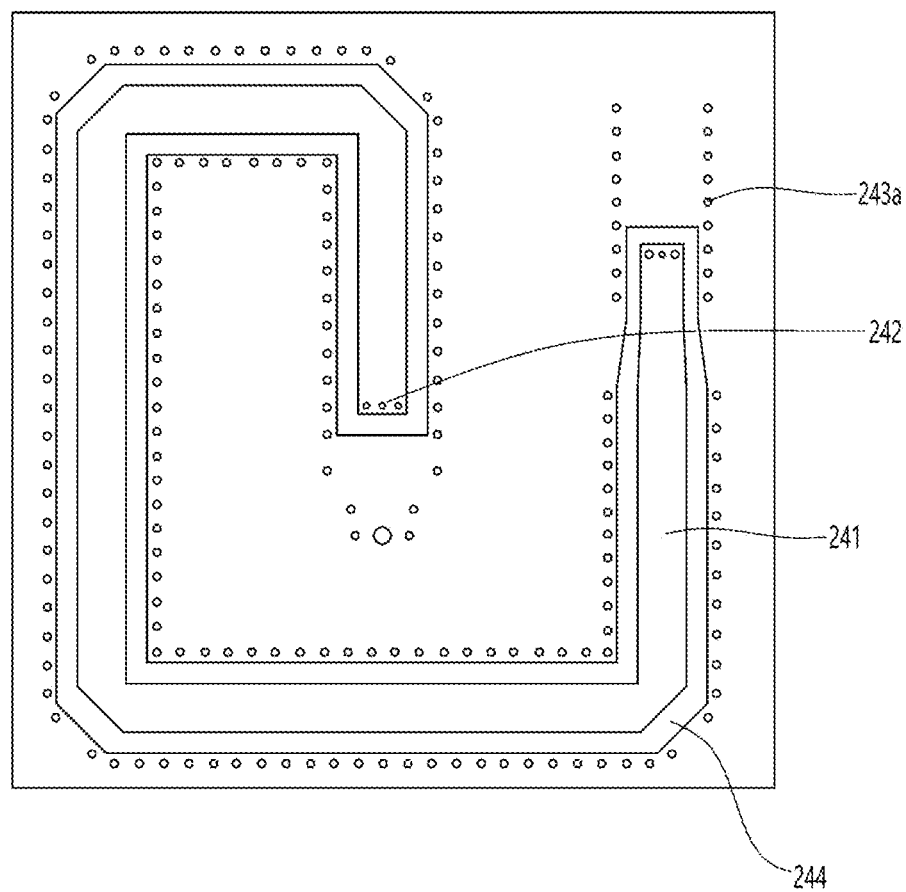
Figure 9:
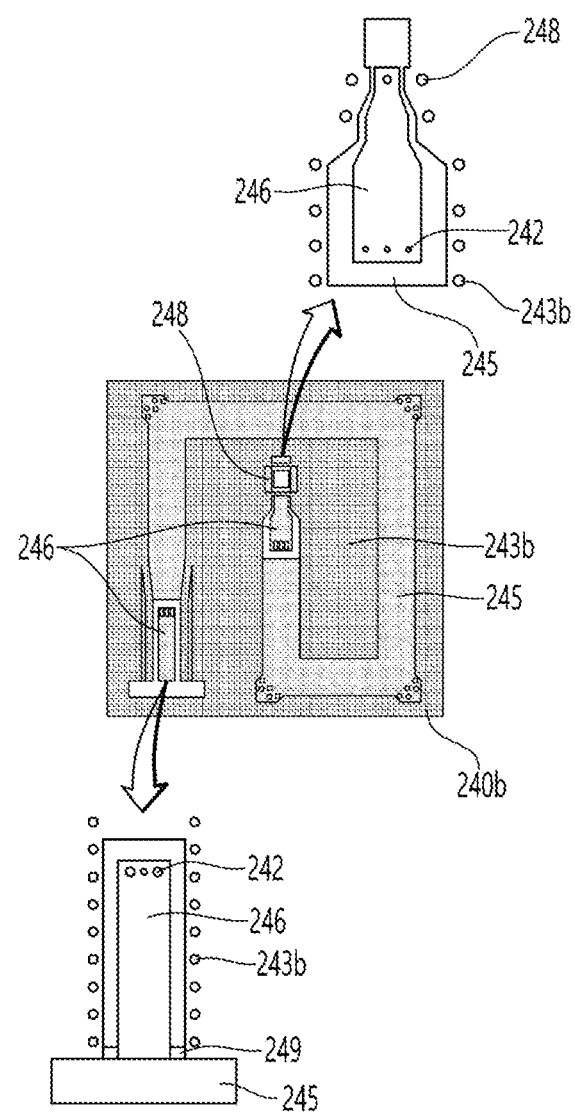
FIG. 9 is an enlarged view of the lower surface structure of one RF coupler in FIG. 7b.
Figure 10:
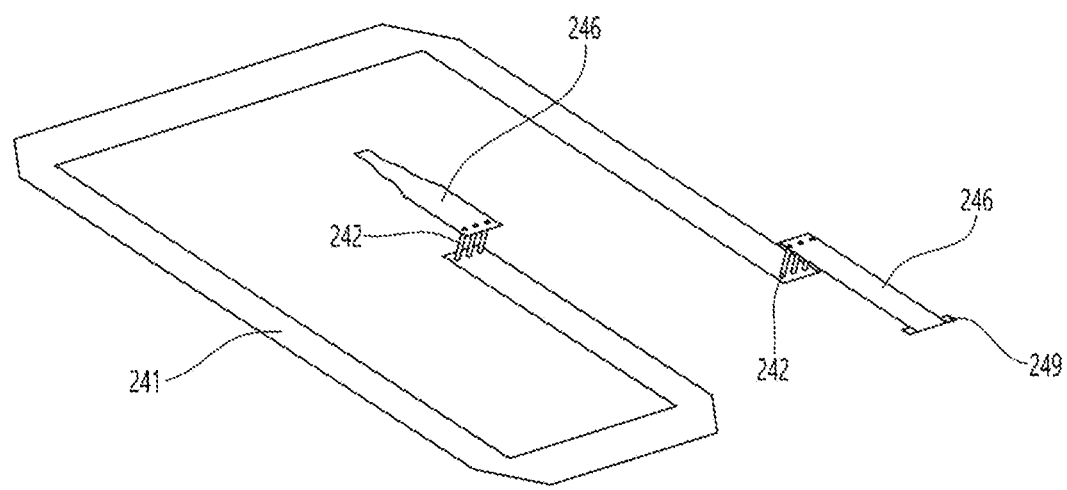
FIG. 10 is a three-dimensional view of a wiring structure of one RF coupler in a shield box for testing a mobile telecommunication terminal of the present disclosure.

FIG. 7a and FIG. 7b are top and bottom views of an RF coupling PCB in a shield box for testing a mobile telecommunication terminal according to an example embodiment of the present disclosure, respectively. FIG. 8 is an enlarged view of the upper structure of one RF coupler in FIG. 7A, and FIG. 9 is an enlarged view of the lower structure of one RF coupler in FIG. 7B. FIG. 10 is a three-dimensional view of a wiring structure of one RF coupler in a shield box for testing a mobile telecommunication terminal according to the present disclosure.

As shown in FIG. 7 to FIG. 10, according to the shield box for testing mobile telecommunication terminals of the present disclosure, the RF coupler 241 closest to each antenna of the plurality of terminal antennas transmits and receives signals between the terminals by arranging the terminal-sized capacitive coupling RF coupler 241 in a MIMO form, for example, a 2*4 matrix form, on the upper surface 240a of the RF coupling PCB 240 to distinguish MIMO signals.

Unlike a radio wave radiator such as an antenna, the RF coupler 241 proposed in the present disclosure has a structure of a transmission line through which signals are transmitted merely in the near field, and since it is not a radio wave radiator, the use of a radio wave absorber inside the shield box main body 180 for reducing multi-path and reflection effects may be minimized.

Specifically, each RF coupler 241 arranged on the upper surface 240a of the RF coupling PCB of the present disclosure is designed to maximize the distance between transmission lines in order to minimize inductive components between transmission lines.

In addition, a port for feeding (hereinafter referred to as a 'feeding part') 248 or a circuit chip, for example, a chip resistor for impedance matching 249, and so on, may not be mounted on the upper surface 240a of the RF coupling PCB where the terminal is placed and in close contact with the terminal, so the feeding part 248 and the chip resistor 249 are disposed on the lower surface 240b of the RF coupling PCB. Each RF coupler 241 of the upper surface 240a of the RF coupling PCB is formed on the signal wire 246 electrically connected to the feeding part 248 on the lower surface 240b of the RF coupling PCB, and it is electrically connected through the via hole connection part 242 of which the surface is metal-plated.

Here, the feeding part 248 and the RF cable connector 213 are electrically connected through an internal RF cable (not shown) provided in the jig frame 220. The chip resistor 249 is also formed on the signal wire 246 while being mounted on the signal wire 246 formed on the lower surface 240b of the RF coupling PCB, and it is electrically connected to each RF coupler 241 on the upper surface 240a of the RF coupling PCB through the via hole connection part 242 whose surface is metal-plated.

Furthermore, for heat dissipation, the upper surface ground 243a and the lower surface ground 243b of the RF coupling PCB 240 are also interconnected through metal-plated via holes, so that heat generated from the terminal is rapidly discharged to the lower portion of the RF coupling PCB 240 through the via hole for upper and lower ground connection.

Reference numeral 244 denotes an insulating part formed around each RF coupler 241 to insulate each RF coupler 241 from the upper surface ground 243a, and 245 denotes an insulating part formed on the lower surface of the RF coupling PCB 240b corresponding to each RF coupler 241 on the upper portion thereof.

The PCB sheet 230 on which the RF coupling PCB 240 is placed may be made of a metal, for example, an aluminum alloy having a relatively high yield strength and excellent processability while being lightweight, and, at the central portion thereof, a cable passage groove 231a through which an internal RF cable connecting the feeding part 248 of the lower surface 240b of the RF coupling PCB and the RF cable connector 213 passes is formed. On the lower surface of the PCB sheet 230, a magnetic material fixing groove 230b into which the magnetic piece of iron 231 having magnetism is inserted without a step is formed.

The terminal interface box 260 is electrically connected to the audio jack and USB jack of the mobile telecommunication terminal, and, for example, the audio codec for the MOS test and a Bluetooth module that exchanges various data, for example, DM (Diagnostic Monitoring) data, through Bluetooth communication with a mobile telecommunication terminal inside the shield box main body 180 and the like may be provided.

Reference numeral 271 denotes a box fixing bracket for fixing the terminal interface box 270, and 272 denotes a cable cover for covering various cables.

Meanwhile, according to the present disclosure, the intake fan bracket mounting hole 180b to which the intake fan bracket 153 to which the intake fan 150 is fixed is mounted on the upper part of the shield box main body 180 in order to quickly dissipate the heat generated by the mobile telecommunication terminal during the test is formed. The intake fan bracket 153 is formed with a plurality of intake holes 153a, for example, with a size of 1 to 10 mm to increase the flow rate according to Bernoulli's principle while minimizing the inflow of external jamming waves so that external air may quickly flow into the shield box main body 180. Reference numeral 151 denotes an intake fan safety net installed outside the intake fan 150.

According to the present disclosure, the rear surface frame 140 is mounted on the open rear surface of the shield box main body 180, and an exhaust vent is formed in the rear surface frame 140. An exhaust fan bracket 163 to which the exhaust fan 162 is fixed is mounted on the outside of the rear surface frame 140. The exhaust fan bracket 163 is formed with a plurality of exhaust holes 163a, for example, with a size of 1 to 10 mm to increase the flow rate according to Bernoulli's principle while minimizing the inflow of external jamming waves so that the air inside the shield box main body 180 may be quickly discharged to the outside. Reference numeral 161 denotes an exhaust fan safety net installed outside the exhaust fan 162, 160 denotes an exhaust fan cover covering the exhaust fan, and 160a denotes an exhaust vent formed on the exhaust fan cover 160.

A radio wave absorber for preventing crosstalk between the RF coupler inside the shield box main body 180 and the terminal antenna may be installed at appropriate places inside the shield box main body 180, for example, on both sides and bottom, respectively, and reference numerals 170 and 171 denote these right and left radio wave absorbers, and 172 denotes a lower radio wave absorber. Reference numeral 173 denotes a radio wave absorber fixing pin for fixing the right radio wave absorber 170 and the left radio wave absorber 171.

Meanwhile, for rapid heat dissipation through the lower surface of the PCB sheet 230, the lower surface of the PCB sheet 230 is in physical contact with the heat sink 174 made of metal, and, to this end, a heat sink mounting hole 170a through which the heat sink 174 is inserted and exposed is formed in the lower radio wave absorber 172.

Furthermore, in order to bring the PCB sheet 230 into close contact with the heat sink 174 while the test jig assembly 200 is accommodated in the shield box main body 180, a magnet 176 for adhering to the PCB sheet is mounted on the heat sink 174 without a step with the upper surface of the heat sink 174, and the magnetic piece of iron 231 is pulled by the magnetic force of the magnet 176 for close contact, so that the PCB sheet 230 is in close contact with the heat sink 174.

Figure 11:
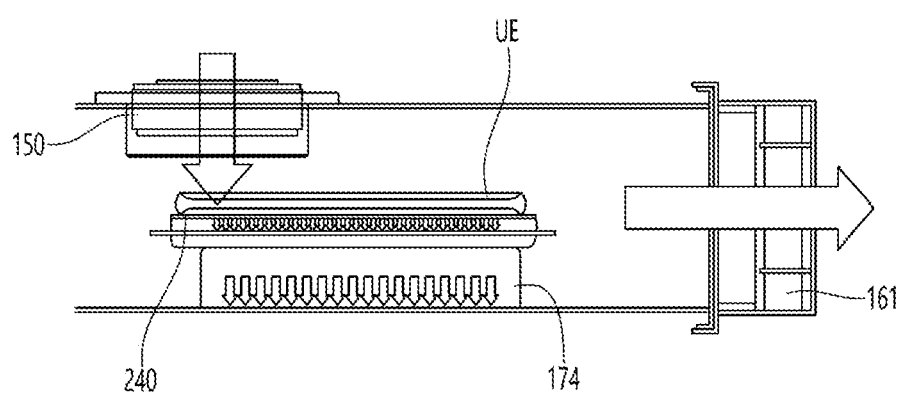
FIG. 11 is a view for explaining the cooling structure of the shield box for testing the mobile telecommunication terminal shown in FIG. 7.

FIG. 11 is a diagram for explaining a cooling structure of the shield box for testing a mobile telecommunication terminal shown in FIG. As shown in FIG. 11, according to the shield box for testing the mobile telecommunication terminal of the present disclosure, after the heat generated from the mobile telecommunication terminal accommodated in the test jig assembly 200 is transferred to the PCB sheet 230 through the ground connection via holes formed countlessly in the RF coupling PCB 240, it is transferred again to the heat sink 174 in physical contact with the PCB sheet 230 and discharged through the heat dissipation holes 110a and 110b of the lower cover 110. In addition, the external air forcibly sucked into the shield box main body 180 through the intake fan 150 formed on the upper part of the shield box main body 180 forcibly discharges the heat of the shield box main body 180 and the heat sink 174 by the exhaust fan 161 installed on the rear side of the shield box main body 180, so that even during a long terminal test, the temperature inside the shield box main body 180 is maintained at the same level as the outside temperature.

Reference numeral 190 denotes a jig entry/exit guide member provided on both sides of the shield box main body 180 to guide the entry/exit of the test jig assembly 200, and reference numeral 175 denotes a spring plunger holding the test jig assembly 200 in right position by applying pressure to the jig entry/exit guide member 190 in a state where the test jig assembly 200 is housed in the shield box main body 180.

Figure 12A:
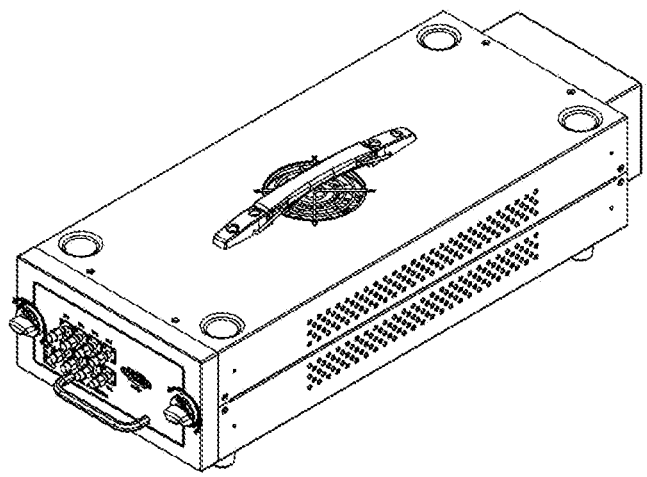
FIG. 12a to FIG. 12f are diagrams illustrating the use of the shield box for testing a mobile telecommunication terminal of the present disclosure, respectively.
Figure 12B:
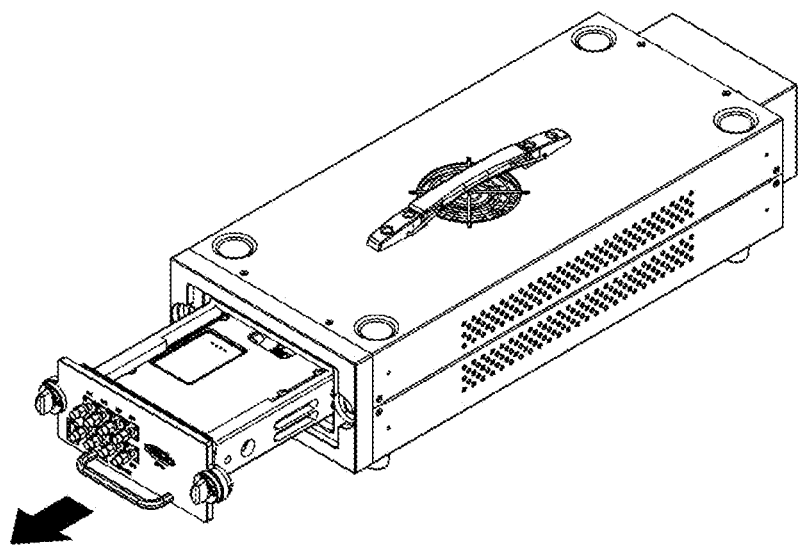

FIG. 12a to FIG. 12f are diagrams illustrating the use of the shield box for testing a mobile telecommunication terminal according to the present disclosure. As shown in FIG. 12a, in a state where the locking lever 212 installed on both sides of the front panel 210 are rotated 90 degrees to be in an OFF state, as shown in FIG. 12b, the jig frame 220 is opened by pulling the handle 211 for opening and closing forward.

Figure 12C:
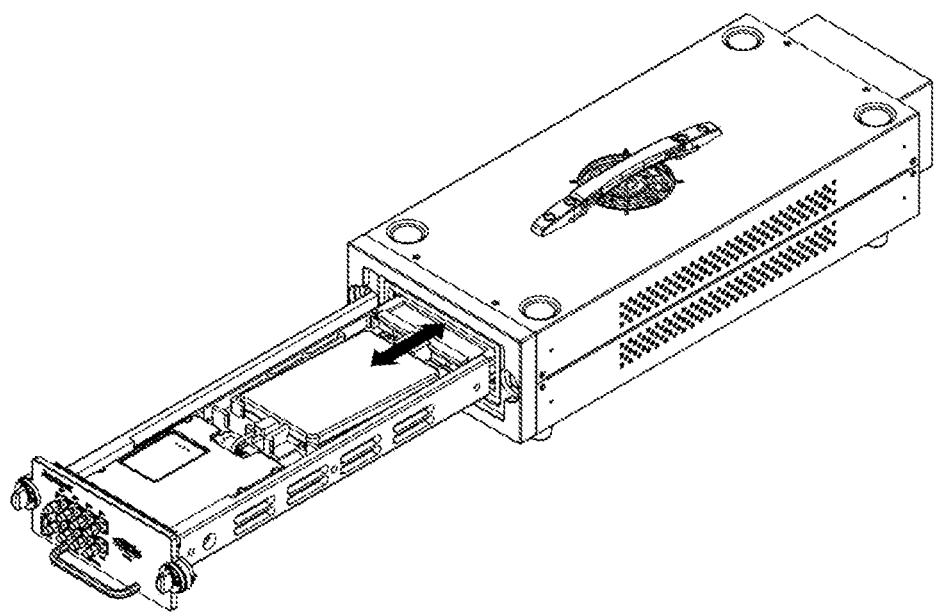
Figure 12D:
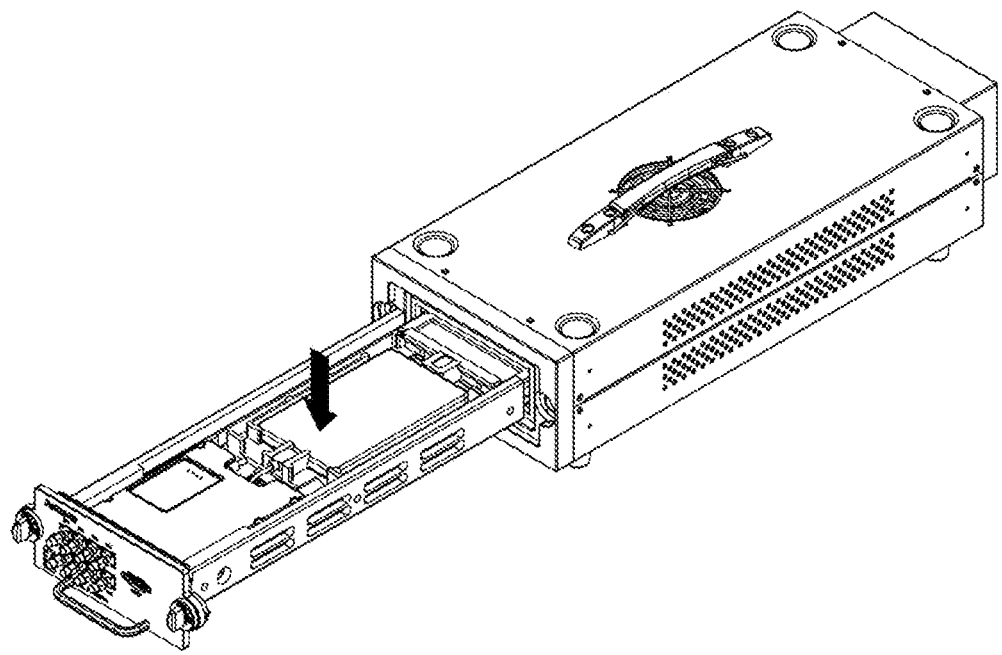
Figure 12E:
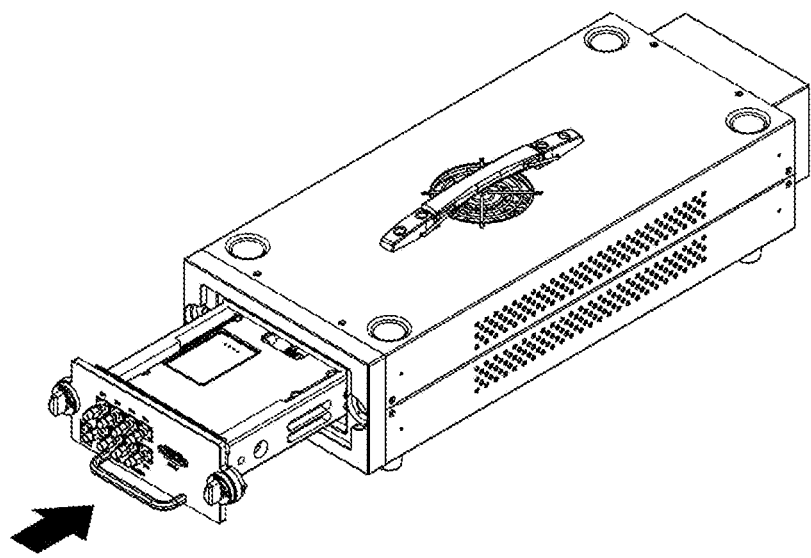

Next, as shown in FIG. 12c, when the USB cable is connected to the mobile telecommunication terminal and the terminal is pushed in, the compression spring 251 is compressed by the clamping slide 250, and then a forward force is applied to the terminal to make the terminal firmly fixed. In this state, as shown in FIG. 12d, after gently pressing the upper surface of the mobile telecommunication terminal to bring the terminal into close contact with the jig frame 220, as shown in FIG. 12e, the jig frame 220 is pushed into the shield box main body 180 by pushing the front panel 210.

Figure 12F:
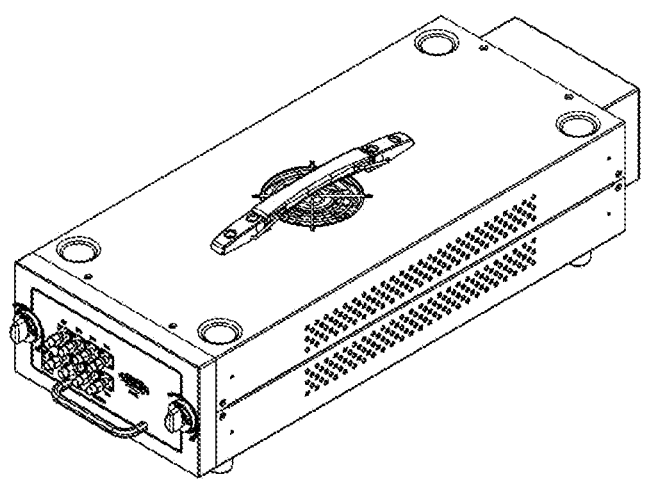

Finally, as shown in FIG. 12f, while pressing the locking lever 212 to an ON state and rotating it 90 degrees, the RF connector is connected to a signal analyzer, channel simulator or base station equipment through an RF cable, and the USB connector is connected to the test PC through a USB cable to perform protocol test or various functional tests on the mobile telecommunication terminal.

Meanwhile, the eight RF couplers 241 provided in the shield box for testing the mobile telecommunication terminal of the present disclosure are electrically connected to the RF cable connector 213 provided on the front panel 210, respectively, so that the user may select and use RF ports appropriate for the test situation, that is, select and use the same number of RF ports as or more than the number of antennas of the terminal under test. For example, during a 4×4 MIMO test, users may connect and use 4 or more RF ports.

In addition, the location of the antenna of the mobile telecommunication terminal may vary depending on the model of the terminal or the frequency band used, and when the location of the antenna of the terminal under test is known, it is preferable to select a coupler closest to the antennas of the terminal, but, in most cases, since the antenna position of the terminal under test is not known, it is preferable to use RF couplers 1, 4, 5, and 8 (refer to the RF coupler arrangement table of FIG. 2*a*) by default.

On the other hand, if it is necessary to select the optimally located RF coupler 241, it may be selected based on the signal power measurement value of the terminal.

As the power source, DC power obtained by rectifying and smoothing commercial AC power may be used.

Figure 13A:
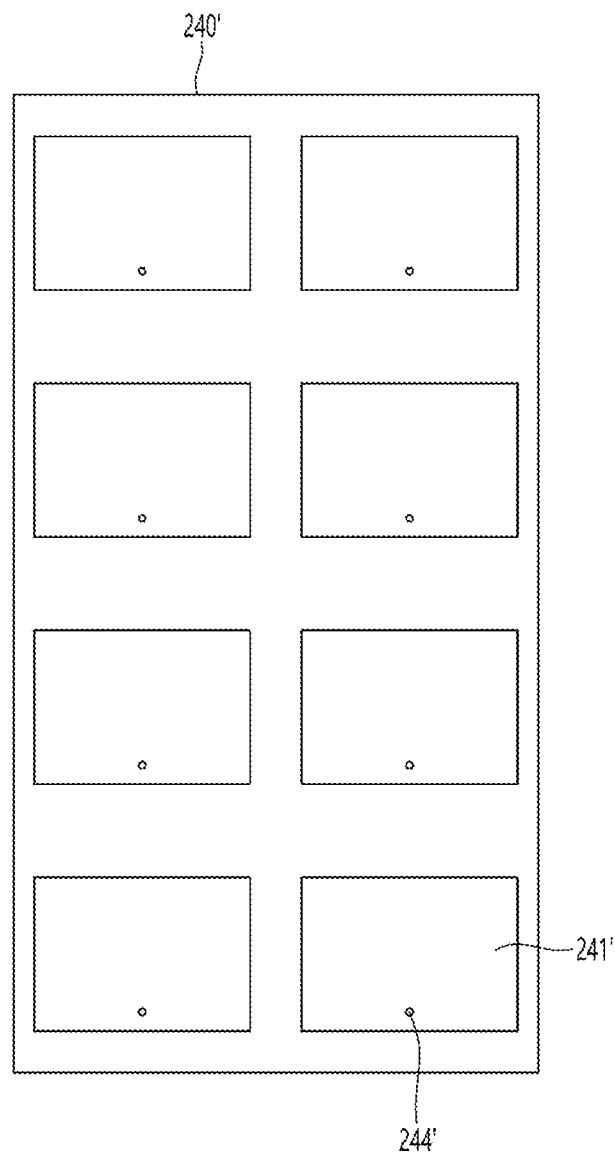
FIG. 13a and FIG. 13b are top and bottom views of a patch antenna PCB in a shield box for testing a mobile telecommunication terminal according to another example embodiment of the present disclosure, respectively.
Figure 13B:
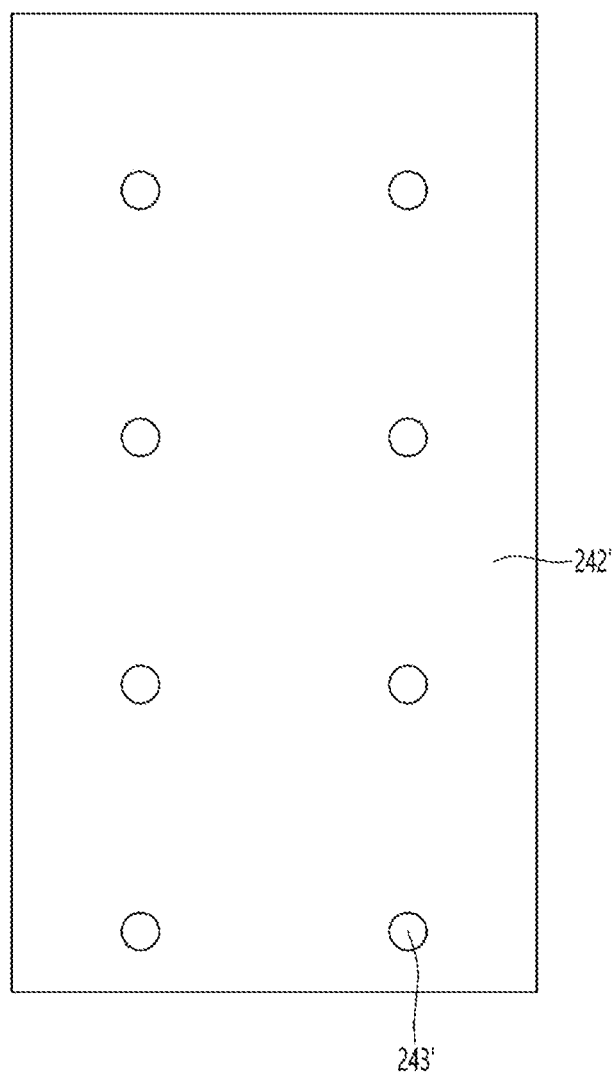
Figure 14:
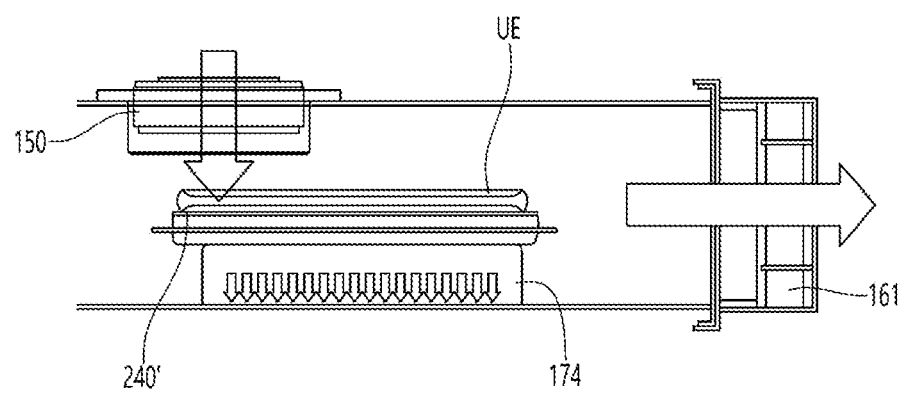
FIG. 14 is a view for explaining the cooling structure of the shield box for testing the mobile telecommunication terminal shown in FIG. 13.

FIG. 13*a* and FIG. 13*b* are top and bottom views of a patch antenna PCB 240' in a shield box for testing a mobile telecommunication terminal according to another example embodiment of the present disclosure, respectively, and FIG. 14 is a diagram for explaining a cooling structure of the shield box for testing a mobile telecommunication terminal shown in FIG. 13.

As shown in FIG. 13, the shield box for testing a mobile telecommunication terminal according to another example embodiment of the present disclosure may use a patch antenna 241' instead of an RF coupler. Such a patch antenna is made by installing metal pieces (patches) such as square, circular, elliptical or triangular on the upper surface of a dielectric plate at regular intervals (much smaller than the size of the patch) on the ground plane (wide metal plate), and in this example embodiment, the rectangular patch antennas 241' are arranged in a 2*4 matrix.

Reference numeral 242' denotes a ground plane formed on the lower surface of the dielectric substrate, reference numeral 244' denotes a feeding point for feeding power to each patch antenna 241', and reference numeral 243' denotes a cable insertion hole formed in the dielectric substrate to connect a coaxial line to the feeding part 244'.

Meanwhile, when a patch antenna, which is a radio wave radiator, is adopted, crosstalk may increase between the mobile telecommunication terminal and each patch antenna 241' inside the shield box main body 180, and such crosstalk may be offset by using the signal processing technology of the related art 2 described above or may be solved by additionally installing a radio wave absorber inside the shield box main body 180.

In the following claims, the RF coupler and patch antenna are referred to as 'non-contact wireless connection part', and the RF coupling PCB and patch antenna PCB are referred to as 'non-contact wireless connection PCB'.

FIG. 14 is a diagram for explaining a cooling structure of the shield box for testing a mobile telecommunication terminal shown in FIG. 13.

As shown in FIG. 14, according to the shield box for testing the mobile telecommunication terminal shown in FIG. 13, after the heat generated from the mobile telecommunication terminal accommodated in the test jig assembly 200 is transferred to the PCB sheet 230, and is transferred again to the heat sink 174 physically contacted with the PCB sheet 230, and discharged through the heat dissipation holes 110*a* and 110*b* of the lower cover 110. In addition, the external air forcibly sucked into the shield box main body 180 through the intake fan 150 formed on the upper part of the shield box main body 180 forcibly discharges the heat of the shield box main body 180 and the heat sink 174 by the exhaust fan 161 installed on the rear side of the shield box main body 180, so that even during a long terminal test, the temperature inside the shield box main body 180 is maintained at the same level as the outside temperature.

Although the preferred example embodiments of the shield box for testing mobile telecommunication terminals of the present disclosure have been described in detail, the present disclosure is not limited to the above-described example embodiments and may be modified in various ways within the scope permitted by the technical spirit of the present disclosure.

For example, merely one of an intake fan and an exhaust fan may be provided while an intake hole or an exhaust hole is provided.

Terms used herein is for describing the embodiments and is not intended to limit the present disclosure. The suffixes "module" and "part" for the components used in the above description are given merely in consideration of the ease of writing the specification, and do not themselves have a meaning or role distinct from each other.

It should be understood that when an element is referred to as being "connected" or "contacted" to another element, it may be directly connected or contacted to the other element, but other elements may exist in the middle.

Singular expressions include plural expressions unless the context clearly dictates otherwise.

In this application, terms such as "comprises", "includes" or "has" are intended to indicate that there is a feature, number, step, operation, component, part, or combination thereof described in the specification, but it should be understood that the presence or addition of one or more other features, numbers, steps, operations, components, parts, or combinations thereof is not precluded. Also, the term 'or' means an inclusive OR rather than an exclusive OR.

Unless otherwise defined, all terms (including technical and scientific terms) used in this specification may be used in a meaning commonly understood by those of ordinary skill in the art to which the present disclosure belongs. In addition, terms defined in commonly used dictionaries are not interpreted ideally or excessively unless specifically defined explicitly.

EXPLANATION OF REFERENCE

110: lower cover,
110*a*, 110*b*: heat dissipation hole,
111: rubber pedestal,
120: upper cover,
120*a*: heat dissipation hole,
120*b*: intake vent,
121: carrying handle,
130: front frame,
131: clamping plates,
132: EMI gasket,
140: rear surface frame,
140*a*: exhaust vent,
150: intake fan,
151: intake fan safety net,
153: intake fan bracket,
153*a*: intake hole,
160: exhaust fan cover,
160*a*: exhaust vent,
161: exhaust fan safety net,
162: exhaust fan,
163: exhaust fan bracket,
163*a*: exhaust hole,
170: right radio wave absorber,
170*a*: heat sink mounting hole,
171: left radio wave absorber,
172: lower radio wave absorber,
173: radio wave absorber fixing pin,
174: heat sink,
175: ball plunger,
176: magnet for close contact, 180: shield box main body,
180a: jig entrance,
180b: intake fan bracket mounting hole,
190: jig entry/exit guide member,
200: test jig assembly,
210: front panel,
211: the handle for opening and closing,
212: locking lever,
213: RF cable connector,
214: RF coupler arrangement table,
215: USB cable connector,
216: EMI gasket,
220: jig frame,
221: terminal accommodating port,
222: audio cable fixing wall,
222a: pressing protrusion,
223: USB cable fixing groove,
224: spring pocket,
230: PCB sheet,
230a: cable passage groove,
230b: magnetic material fixing groove,
231: magnetic piece of iron,
240: PCB RF coupling PCB,
240a: PCB upper surface,
240b: PCB lower surface,
241: RF Coupler,
242: via hole connection part,
243a: upper surface ground,
243b: lower surface ground,
244: Insulating part,
245: Insulating part,
246: signal wire,
248: Feeding part,
249: chip resistor,
240: patch antenna PCB,
241': patch antenna,
242': ground plane,
243': cable insertion hole,
244': Feeding part,
250: clamping slide,
251: compression spring,
252: spring pin,
253: slide cover,
254: terminal clamper,
260: terminal interface box,
270: USB hub assembly,
271: box fixing bracket,
272: cable cover

What is claimed is:

1. A shield box for testing a mobile telecommunication terminal including:
a shield box main body made of metal, having a jig entrance formed on a front side, and equipped with a vent which a plurality of vent holes of 1 to 10 mm in size are formed on upper and rear sides, respectively;
a test jig assembly installed to be able to enter and exit through the jig entrance while mounting a PCB for non-contact wireless connection in which a plurality of non-contact wireless connection parts that are wirelessly connected to a mobile telecommunication terminal and transmit and receive signals are arranged; and
a ventilation fan mounted on the vent of the upper side or the vent of the rear side;
wherein the vent of the upper side is an intake vent, the vent of the rear side is an exhaust vent, an intake fan is mounted on the intake vent, and an exhaust fan is mounted on the exhaust vent;
wherein an intake hole is formed in the intake vent and an intake fan bracket to which the intake fan is fixed is mounted, and an exhaust hole is formed in the exhaust vent and an exhaust fan bracket to which the exhaust fan is fixed is mounted; and
wherein the test jig assembly includes: a jig frame on which the PCB for the non-contact wireless connection is mounted; a front panel mounted on a front surface of the jig frame and having an RF cable connector installed thereon; a PCB sheet installed on the jig frame and on which the PCB for the non-contact wireless connection is placed; a terminal interface box equipped with various interfaces with mobile telecommunication terminals; and a clamping part installed at a rear of the jig frame and firmly fixing mobile telecommunication terminals of various sizes to the predetermined position of the jig frame by an elastic force of a compression spring.

2. The shield box of claim 1,
wherein an upper half of the shield box main body is made of metal and is covered with an upper cover having a plurality of heat dissipation holes formed on at least one side wall thereof,
a lower half of the shield box body is made of metal and is covered with a lower cover having a plurality of heat dissipation holes formed on at least one side wall thereof or a lower wall,
a pedestal for separating the shield box from a supporting surface, is installed at each corner of the lower wall of the lower cover.

3. The shield box of claim 1,
wherein a heat sink for dissipating heat from the PCB sheet is installed in the shield box main body below the PCB sheet.

4. The shield box of claim 3,
wherein a magnet is mounted on the heat sink without forming a step with an upper surface of the heat sink, and
on a lower surface of the PCB sheet, a magnetic material fixing groove is formed into which a magnetic piece of iron having magnetism is inserted without a step with the lower surface.

5. The shield box of claim 4,
wherein the non-contact wireless connection part is a patch antenna.

6. The shield box of claim 4,
wherein the non-contact wireless connection part is an RF coupler.

7. The shield box of claim 6,
wherein the PCB for non-contact wireless connection comprises a CPWG (Coplanar Waveguide with Ground) structure PCB in which ground is disposed on a top and a bottom of a dielectric.

8. The shield box of claim 7,
wherein, on an upper surface of the PCB for non-contact wireless connection, RF couplers are arranged in a matrix form of two or more rows horizontally and two or more columns vertically and is designed to maximize a distance between transmission lines to minimize inductive components between the transmission lines,
a feeding part for supplying power to the RF coupler is disposed on the lower surface of the PCB for non-contact wireless connection, and
each of the RF couplers and each of a feeding part are electrically connected through a via hole connection part whose surface is made of a conductor.

9. The shield box of claim 8,
wherein an upper surface ground and a lower surface ground of the PCB for non-contact wireless connection are connected to each other through a via hole whose surface is made of a conductor.

10. The shield box of claim 6,
wherein the jig frame is formed of a non-metallic material having an opening through which the RF coupler is exposed and a terminal accommodating port in which a mobile telecommunication terminal is accommodated.

11. The shield box of claim 10,
wherein a USB cable fixing groove in which a USB cable connected to a USB connection jack of a mobile telecommunication terminal is fixed is formed in the jig frame at a center of a front surface of the terminal accommodating port.

12. The shield box of claim 11,
wherein the PCB sheet is made of metal, and a cable passage groove through which an internal RF cable connecting the feeding part and the RF cable connector passes is formed at a central portion thereof.

13. The shield box of claim 12,
wherein the front panel has a handle for opening, closing, and holding the test jig assembly by hand and moving it in and out of the shield box main body, and a locking lever equipped with a clamping function for firmly fixing the test jig assembly housed in the shield box main body to the shield box main body with a spring provided therein.

14. The shield box of claim 13,
wherein a RF coupler arrangement table indicating an arrangement position of each of a plurality of the RF couplers is attached to the front panel.

15. The shield box of claim 14, wherein the shield box main body has opposing side walls and further including:
a jig entry and exit guide member installed on each of the side walls of the shield box main body to guide entry and exit of the test jig assembly, and
a spring plunger for holding the test jig assembly in right position by applying pressure to the jig entry and exit guide member in a state where the test jig assembly is accommodated inside the shield box main body.

16. The shield box of claim 15,
wherein the terminal interface box is electrically connected to an audio jack and a USB jack of a mobile telecommunication terminal, and is provided with a Bluetooth communication module for Bluetooth communication with an audio codec and a mobile telecommunication terminal.

* * * * *